(12) United States Patent
Garcia et al.

(10) Patent No.: US 6,597,925 B1
(45) Date of Patent: Jul. 22, 2003

(54) TRANSMITTER CIRCUIT WITH FREQUENCY SELF-OPTIMIZATION

(75) Inventors: Jose M. Garcia, Wayne, NJ (US); Vladimir Levitine, Union, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/527,010

(22) Filed: Mar. 16, 2000

(51) Int. Cl.[7] .................................................. H04B 1/38
(52) U.S. Cl. ........................ 455/561; 455/127; 455/115; 455/120; 330/130
(58) Field of Search ............................... 455/561, 572, 455/127, 115, 552, 553, 120; 330/296, 127, 130

(56) References Cited

U.S. PATENT DOCUMENTS 6,259,318 B1 * 7/2001 Mielke et al. ............... 330/129

* cited by examiner

Primary Examiner—Lester G. Kincaid
Assistant Examiner—Ronald J. Ward
(74) Attorney, Agent, or Firm—Steve Mendelsohn

(57) ABSTRACT

In a transmitter circuit designed to operate over a specified transmit frequency range, information as to the specific frequency within the specified transmit frequency range at which the transmit up-converter of the transmitter circuit is to be operated, is used to generate a control signal for a high-power amplifier within the transmitter circuit, where the high-power amplifier automatically optimizes its operations based on the frequency indicated by the control signal. For example, for the transmitter circuit of a PCS base station transmitter, control signals received by the transmit up-converter from an alarm control board identify the particular 5-MHZ or 15-MHZ PCS frequency block for the base station transmitter. The up-converter uses that frequency information to generate a two-bit control signal identifying one of three 20-MHZ frequency sub-ranges within the 60-MHZ PCS forward-link transmit frequency range. The high-power amplifier uses that two-bit control signal to retrieve values from memory for tunable parameters and uses those tunable parameters to optimize its operations, thereby achieving acceptable low levels of intermodulation distortion at any PCS frequency block within the full 60-MHZ PCS frequency range.

30 Claims, 3 Drawing Sheets

TRANSMITTER CIRCUIT WITH FREQUENCY SELF-OPTIMIZATION

BACKGROUND OF THE INVENTION

1. Field of the Invention

The present invention relates to electronic circuitry, and, in particular, to power amplifiers for telecommunication applications.

2. Description of the Related Art

Wireless telecommunication systems typically operate over specific ranges of signal frequencies. For example, according to the U.S. PCS (Personal Communication System) standard for CDMA (code-division, multiple-access) communications, forward-link transmissions from base stations to mobile units occur within the 60-MHZ frequency range from 1930 MHZ to 1990 MHZ. (Reverse-link transmissions from the mobile units back to the base stations occur within a different frequency range.) The 60-MHZ forward-link transmit frequency range is divided into six frequency blocks: three 15-MHZ frequency blocks, each with eleven 1.25-MHZ frequency channels, and three 5-MHZ frequency blocks, each with three 1.25-MHZ frequency channels, for a total of 42 frequency channels, where each frequency channel can support up to, for example, 64 different CDMA code channels.

When configured in the field, a particular base station is assigned to operate within a particular PCS frequency block. In order to avoid having to design, build, and inventory six different types of base station transmitters (one for each different PCS frequency block), a single generic base station transmitter design is typically used for all frequency blocks. In that case, it is important that the generic base station transmitter operate satisfactorily at all frequencies within the 60-MHZ forward-link transmit frequency range.

FIG. 1 shows a block diagram of a conventional base station transmitter circuit 100 used in the forward-link transmitters of PCS telecommunication systems. Base station transmitter circuit 100 has an oscillator 102 that generates an RF (radio frequency) signal 104 having a frequency between 869 MHZ and 894 MHZ, and a transmit up-converter 106 that converts RF signal 104 into a PCS block signal 108 having a frequency corresponding to one of the PCS frequency blocks within the 1930–1990 MHZ PCS range (e.g., the center frequency for a particular 5-MHZ or 15-MHZ PCS frequency block). The particular PCS frequency block is specified by a digital control signal 120 received from alarm control board (ACB) 118.

PCS block signal 108 generated by up-converter 106 is then provided to high-power amplifier 110, which further amplifies the PCS block signal to generate an amplified PCS block signal 112 for subsequent transmitter processing (e.g., tuning to a particular PCS frequency channel within the PCS frequency block, data and code modulation, and transmission) (not shown in FIG. 1). In one implementation of base station transmitter circuit 100, high-power amplifier 110 is a Model No. 34874/EB500600-3 amplifier from MPD Technologies, Inc., a subsidiary of Microwave Power Devices, Inc., of Hauppauge, N.Y.

In addition, as indicated in FIG. 1, an amplifier alarm signal 114 is fed back to transmit up-converter 106 from high-power amplifier 110 to indicate the presence of an alarm condition within high-power amplifier 110. A transmit up-converter alarm signal 116 is also fed back to alarm control board 118 from transmit up-converter 106 to indicate the presence of an alarm condition within either transmit up-converter 106 or high-power amplifier 110.

FIG. 2 shows a block diagram of a conventional transmit up-converter 106 for base station transmitter circuit 100 of FIG. 1. As shown in FIG. 2, up-converter 106 receives RF signal 104 from oscillator 102 of FIG. 1 at 1-dB pad 202. Mixer 206 mixes the received RF signal with a mixing signal 224 from low-pass filter 222 to convert the received RF signal into a mixer output signal 204 having the desired PCS block frequency. Mixer output signal 204 is processed through potentiometer 208, 5-dB amplifier 210, 20-dB amplifier 212, and band-pass filter 214 to generate PCS block signal 108 for transmission to high-power amplifier 110 of FIG. 1.

Synthesizer 218 receives control signal 120 from ACB 118 and, in conjunction with 5-dB amplifier 220 and low-pass filter 222, converts a 15-MHZ local clock signal 216 into mixing signal 224 having a frequency appropriate to cause mixer 206 to generate mixer output signal 204 having the desired PCS block frequency specified by control signal 120. Synthesizer 218, which may comprise a phase-locked loop circuit or other controllable signal generator, generates a lock detect signal 226 to indicate when the desired frequency for mixing signal 224 has been achieved.

Logic circuits 228 (1) receive lock detect signal 226 from synthesizer 218 and amplifier alarm signal 114 from high-power amplifier 110 and (2) generate control signals 230 for voltage regulators and switches 232, which in turn generate signals to control the gains of amplifiers 210, 212, and 220. In addition, transmit up-converter alarm signal 116 is fed back from logic circuits 228 to alarm control board 118.

In telecommunication systems, it is important to limit intermodulation distortion (IMD) (also known as spectral regrowth (SR) in CDMA systems). Intermodulation distortion is a key performance-degrading effect in an amplifier, because it causes interference to adjacent channels that cannot be filtered out. IMD is a non-linear effect that is caused by the amplifier's input power-output power characteristics being non-linear rather than linear. The non-linear characteristic is due to the physical properties of the semi-conductor material used to fabricate the power transistors used in the amplifier. To get a linear input-output characteristic, some form of linearization, such as feed-forward and/or predistortion, is typically used, but it still usually does not provide optimum performance over a wide frequency range.

Thus, although an amplifier can be sufficiently optimized over a specific narrow frequency range (e.g., up to about a 20-MHZ frequency range), it is difficult to optimize a single amplifier to provide low levels of IMD across the entire 60-MHZ frequency range that PCS base station forward-link transmitters need to be able to support. One option is to design amplifiers, such as high power amplifier 110 of FIG. 1, to be so-called smart amplifiers that have complicated circuitry (e.g., frequency detection circuitry) that measures the frequency of the received signal, such as PCS block signal 108 of FIG. 1, and then automatically optimizes the operations of the amplifier accordingly based on that measured frequency. Unfortunately, such an option is often cost prohibitive for implementation in the base stations of typical PCS telecommunication systems. As a result, typical base station amplifiers, such as base station transmitter circuit 100 of FIG. 1, are optimized during manufacturing as best as possible for the entire 60-MHZ PCS forward-link frequency range, and then no optimization is performed when the base station is subsequently configured in the field (when the particular PCS frequency block for the base station is first known).

SUMMARY OF THE INVENTION

The present invention is directed to a transmitter circuit with frequency self-optimization for use in base station forward-link transmitters of wireless telecommunication systems conforming, for example, to the U.S. PCS standard. The self-optimizing base station transmitter circuit of the present invention uses digital information, already available in conventional base station transmitter circuits after they are configured for operation in the field, that indicates the specific PCS frequency block assigned to the base station, to optimize amplifier operations based on the specified PCS frequency block. As a result, the self-optimizing base station transmitter circuit can provide better performance (e.g., lower intermodulation distortion) over the entire 60-MHZ PCS frequency range than that provided by conventional base station transmitter circuits, without requiring the use of expensive smart amplifiers within the transmitter circuit. Moreover, since the present invention relies on the actual digital information used to indicate the specific PCS frequency block, the present invention may even be more accurate than transmitter designs that rely on smart amplifiers to detect block frequency. In addition, because the present invention reduces intermodulation distortion, the present invention can be used to increase system capacity (e.g., more CDMA codes per PCS frequency channel and/or greater base station coverage areas) by enabling higher transmit power levels without violating FCC rules regarding interference with transmissions in other frequency bands.

In one embodiment, the present invention is a transmitter circuit designed to operate over a specified transmit frequency range, comprising (a) an oscillator configured to generate a first signal at a first frequency; (b) an up-converter configured to convert the first signal into a second signal at a second frequency different from the first frequency, wherein the second frequency falls within the specified transmit frequency range and is specified by frequency information available within the up-converter; and (c) an amplifier configured to amplify the second signal. The up-converter generates a control signal for the amplifier based on the frequency information used to specify the second frequency, and the amplifier uses the control signal to automatically optimize its operations for amplifying the second signal.

In another embodiment, the present invention is an amplifier for use in a transmitter circuit designed to operate over a specified transmit frequency range, wherein the amplifier is configured to (1) receive and amplify an input signal having an input frequency within the specified transmit frequency range, (2) receive a control signal corresponding to the input frequency of the input signal, and (3) use the control signal to automatically optimize its operations for amplifying the input signal.

In yet another embodiment, the present invention is a method for generating signals within a transmitter circuit designed to operate over a specified transmit frequency range, comprising the steps of (a) generating a first signal at a first frequency; (b) converting the first signal into a second signal at a second frequency different from the first frequency, wherein the second frequency falls within the specified transmit frequency range and is specified by frequency information available within the transmitter circuit; (c) generating a control signal based on the frequency information used to specify the second frequency; and (d) amplifying the second signal with an amplifier, wherein the amplifier receives and uses the control signal to automatically optimize its operations for amplifying the second signal.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
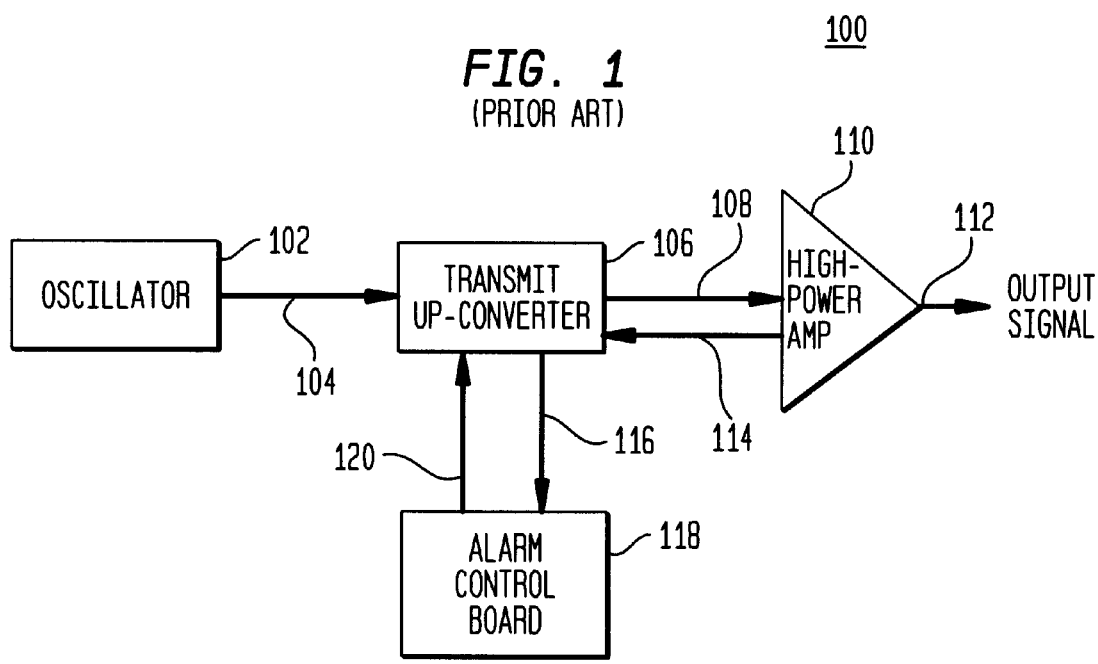
FIG. 1 shows a block diagram of a conventional base station transmitter circuit used in the forward-link transmitters of PCS telecommunication systems.
Figure 3:
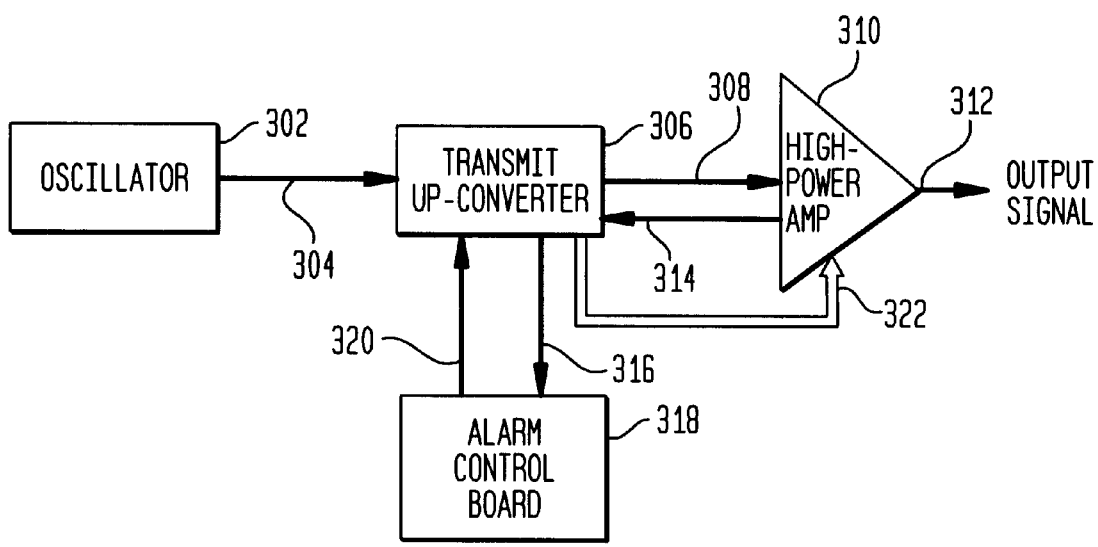
FIG. 3 shows a block diagram of a base station transmitter circuit used in the forward-link transmitters of PCS telecommunication systems, according to one embodiment of the present invention.

FIG. 3 shows a block diagram of a base station transmitter circuit 300 used in the forward-link transmitters of PCS telecommunication systems, according to one embodiment of the present invention. As shown in FIG. 3, base station transmitter circuit 300 comprises an oscillator 302, transmit up-converter 306, high-power amplifier 310, and alarm control board 318. As in conventional base station transmitter circuit 100 of FIG. 1, oscillator 302 of base station transmitter circuit 300 generates an RF signal 304 that is converted by transmit up-converter 306 into a PCS block signal 308 that is then amplified by high-power amplifier 310 to generate an amplified PCS block signal 312 for subsequent transmitter processing (not shown), where the particular PCS frequency block in the 60-MHZ PCS frequency range is specified in a control signal 320 received by transmit up-converter 306 from alarm control board 318. As in conventional base station transmitter circuit 100, high-power amplifier 310 feeds back an alarm signal 314, and transmit up-converter 306 feeds back an alarm signal 316 to alarm control board 318.

In addition to those conventional signals, however, transmit up-converter 306 generates a set of control signals 322 for high-power amplifier 310. These control signals identify a specific sub-range of frequencies within the 60-MHZ PCS frequency range corresponding to the PCS frequency block identified in control signal 320 received from alarm control board 318. In one implementation, control signals 322 comprise two bits of information used to identify one of three 20-MHZ sub-ranges (e.g., (01) for 1930 to 1950 MHZ, (10) for 1950 to 1970 MHZ, and (11) for 1970 to 1990 MHZ) within the 60-MHZ PCS frequency range. The fourth two-bit value (00) may be reserved as a reset signal to inform the high-power amplifier during circuit testing that a new value is being provided.

According to this implementation of the present invention, high-power amplifier 310 is designed to automatically optimize its operations based on the particular 20-MHZ sub-range identified in control signal 320. Since amplifiers can be sufficiently optimized for 20-MHZ frequency ranges for typical PCS applications, this implementation of the present invention ensures satisfactory performance of base station transmitter circuit 300 (e.g., in terms of sufficiently low intermodulation distortion). In one implementation, high-power amplifier 310 retrieves values from memory (e.g., a lookup table) for tunable parameters for the specified frequency sub-range and uses those tunable parameters to fine-tune its operations. It will be understood that, in other implementations, more specific block frequency information could be provided by transmit up-converter 306 to high-power amplifier 310 to achieve optimization over narrower frequency sub-ranges (e.g., the particular 5-MHZ or 15-MHZ PCS frequency block).

Figure 2:
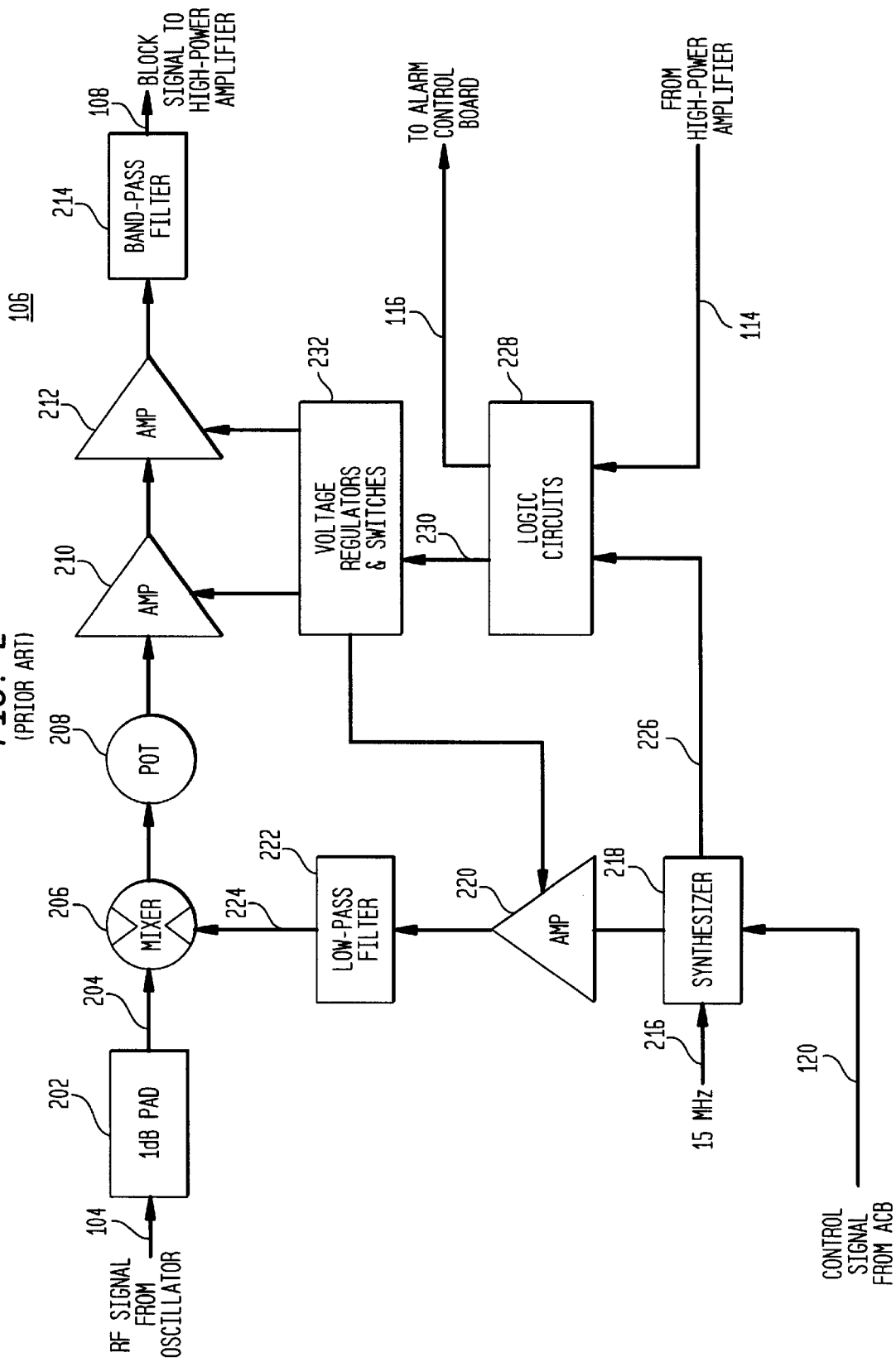
FIG. 2 shows a block diagram of a conventional transmit up-converter for the base station transmitter circuit of FIG. 1.
Figure 4:
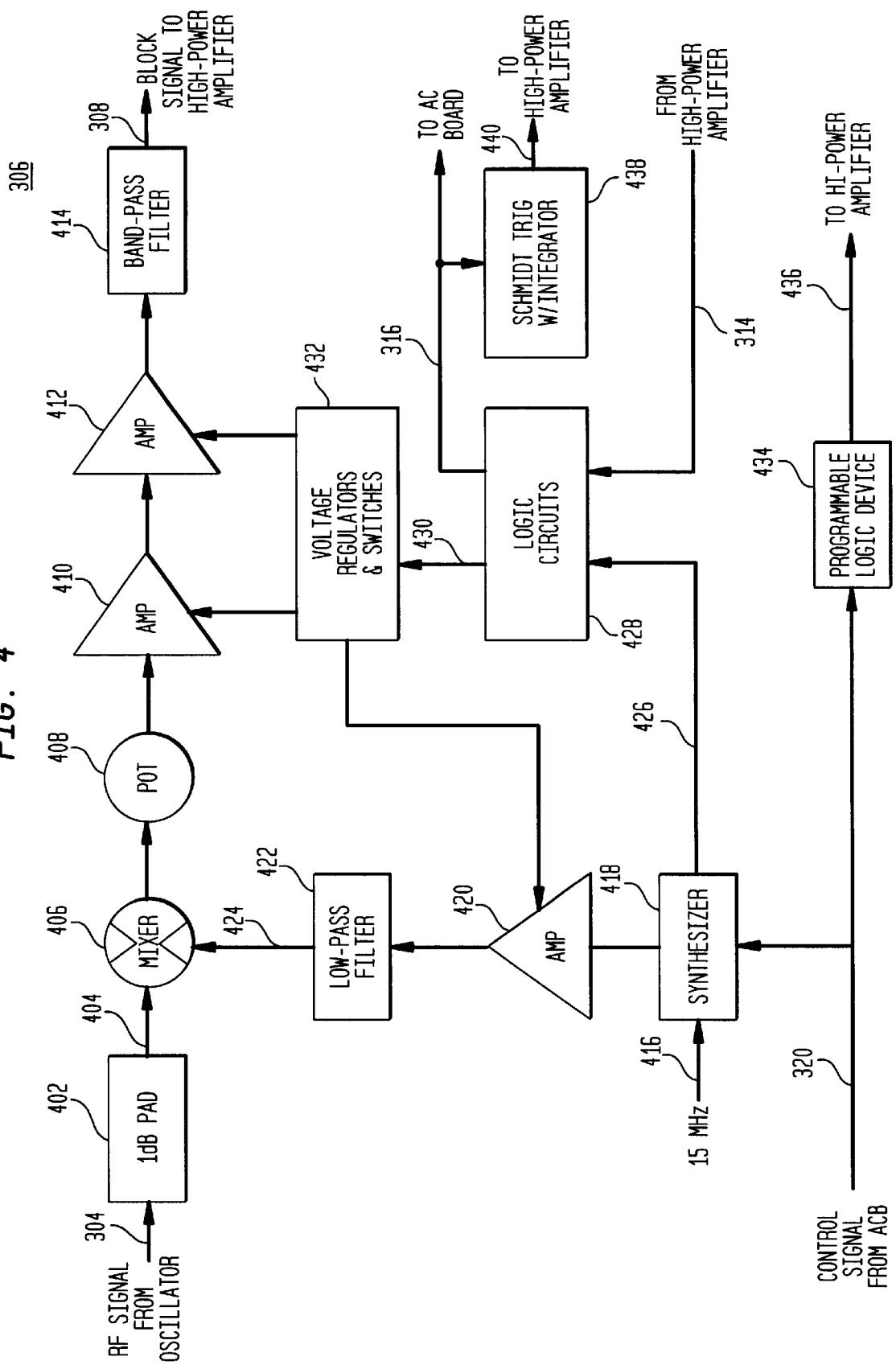
FIG. 4 shows a block diagram of a transmit up-converter for the base station transmitter circuit of FIG. 3.

FIG. 4 shows a block diagram of transmit up-converter 306 for base station transmitter circuit 300 of FIG. 3. Elements 402–432 of transmit up-converter 306 are analogous to and operate similarly to corresponding elements 202–232 of conventional transmit up-converter 106 of FIG. 2. In addition, however, according to this implementation of the present invention, transmit up-converter 306 has a programmable logic device (PLD) (or other suitable processing device) 434 and a processing block 438 comprising a Schmidt trigger with an integrator.

Like synthesizer 418, PLD 434 receives control signal 320 from alarm control board 318. PLD 434 processes information within control signal 320 to determine the particular PCS frequency block specified in control signal 320 for transmit up-converter 306. PLD 434 uses this PCS frequency block information to generate a 2-bit control signal 436 that identifies the corresponding 20-MHZ frequency sub-range used by high-power amplifier 310 to optimize its operations. Control signal 436 forms part of control signals 322 shown in FIG. 3. In one implementation, PLD 434 also receives enable and clock signals from ACB 318.

In one implementation, up-converter 306 is configured with pull-up resistors tied to control signal 436 to ensure that appropriate default values are applied that result in high-power amplifier 310 being optimized to the center of the 60-MHZ PCS frequency range (i.e., about 1960 MHZ) in case of a failure in transmit up-converter 306.

In addition, block 438 monitors alarm signals 316 from logic circuits 428 to generate a reset signal 440 for high-power amplifier 310. In particular, within block 438, the integrator accumulates alarm signals 316, and the Schmidt trigger generates reset signal 440 based on the resulting accumulated integrator signal. Like control signal 436, reset signal 440 forms part of control signals 322 shown in FIG. 3. High-power amplifier 310 uses reset signal 440 to determine whether to reset its operations.

In one implementation, control signal 320 generated by alarm control board 318 includes a 19-bit value that identifies the particular PCS frequency block as shown in Table 1. As indicated in Table 1, the first 6 bits and last 3 bits of each 19-bit control value are identical for all six different PCS frequency blocks; only the "middle" 10 bits vary for the different PCS frequency blocks. In one implementation, PLD 434 processes those ten middle bits to identify the specified PCS frequency block and generate Bits A and B for the two-bit control signal 436 to be transmitted to high-power amplifier 310 as shown in Table I.

TABLE I

CONTROL SIGNAL VALUES

| PCS BLOCK | FREQUENCY RANGE | 19-BIT CONTROL VALUE | BIT A | BIT B |
|---|---|---|---|---|
| A | 1930–1945 MHZ | (0010100101100100000) | 0 | 1 |
| B | 1950–1965 MHZ | (0010101000101000000) | 1 | 0 |
| C | 1970–1985 MHZ | (0010101100100101000) | 1 | 1 |
| D | 1945–1950 MHZ | (0010100111101111000) | 0 | 1 |
| E | 1965–1970 MHZ | (0010101011000011000) | 1 | 0 |
| F | 1985–1990 MHZ | (0010101011101100000) | 1 | 1 |

Although the present invention has been described in the context of a base station transmitter circuit having a transmit up-converter, embodiments of the present invention could have other designs. For example, an alternative transmitter circuit of the present invention could have a radio designed to generate a signal having the appropriate frequency without needing to be up-converted to the PCS range. A processing device (e.g., a PLD) implemented either within or separate from the high-powered amplifier would then process the control signal from the alarm control board (or other circuit within the base station that has the frequency information available) to determine the appropriate frequency sub-range used in optimizing the high-powered amplifier. When the PLD is implemented within the high-powered amplifier, the control signal from the alarm control board could be input directly to the high-powered amplifier without going through any intermediate circuitry.

Although the present invention has been described in the context of the 60-MHZ PCS forward-link frequency band from 1930 MHZ to 1990 MHZ, embodiments of the present invention could be designed to operate over other frequency ranges. As such, the present invention can be applied to design base station transmitter circuits for the transmitters of base stations for wireless telecommunication systems conforming to telecommunications standards other than the U.S. PCS standard. In addition, the present invention can be used in other applications where digital information is available identifying a specific block or channel frequency to achieve a self-optimizing transmitter circuit, whether for use in base station transmitters or other situations.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A transmitter circuit designed to operate over a specified transmit frequency range, comprising:
   (a) an oscillator configured to generate a first signal at a first frequency;
   (b) an up-converter configured to convert the first signal into a second signal at a second frequency different from the first frequency, wherein the second frequency falls within the specified transmit frequency range and is specified by frequency information available within the up-converter; and
   (c) an amplifier configured to amplify the second signal, wherein:
   the up-converter generates a control signal for the amplifier based on the frequency information used to specify the second frequency;
   the amplifier uses the control signal to automatically optimize its operations for amplifying the second signal;
   the specified transmit frequency range is a base station forward-link transmit frequency range for a wireless telecommunication system;
   the second frequency corresponds to a specific frequency block within the base station forward-link transmit frequency range; and
   the control signal identifies a sub-range within the base station forward-link transmit frequency range corresponding to the specific frequency block.

2. The invention of claim 1, wherein, based on the control signal, the amplifier retrieves one or more values from memory for one or more tunable parameters and uses the tunable parameters to optimize its operations for amplifying the second signal.

3. The invention of claim 1, further comprising an alarm control board configured to provide the up-converter with the frequency information, wherein the up-converter comprises a programmable logic device configured to process the frequency information to generate the control signal for the amplifier.

4. The invention of claim 3, wherein the frequency information is transmitted from the alarm control board to the up-converter as a 19-bit value that identifies one of six different frequency blocks within the specified transmit frequency range.

5. The invention of claim 3, wherein the up-converter further comprises a processing block configured to monitor alarm signals from the up-converter to the alarm control board to generate a reset signal for the amplifier.

6. The invention of claim 5, wherein the processing block comprises a Schmidt trigger configured with an integrator, wherein the integrator accumulates the alarm signals to generate an accumulated integrator signal, and the Schmidt trigger generates the reset signal based on the accumulated integrator signal.

7. The invention of claim 1, wherein:
the base station forward-link transmit frequency range is a PCS base station forward-link transmit frequency range; and
the specific frequency block is one of six different PCS frequency blocks within the PCS base station forward-link transmit frequency range.

8. The invention of claim 7, wherein the control signal comprises a two-bit value identifying one of three different frequency sub-ranges within the PCS base station forward-link transmit frequency range.

9. The invention of claim 8, further comprising an alarm control board configured to provide the up-converter with the frequency information, wherein the up-converter comprises a programmable logic device configured to process the frequency information to generate the control signal for the amplifier, wherein:
the frequency information is transmitted from the alarm control board to the up-converter as a 19-bit value that identifies one of six different frequency blocks within the specified transmit frequency range;
the up-converter further comprises a processing block configured to monitor alarm signals from the up-converter to the alarm control board to generate a reset signal for the amplifier;
the processing block comprises a Schmidt trigger configured with an integrator, wherein the integrator accumulates the alarm signals to generate an accumulated integrator signal, and the Schmidt trigger generates the reset signal based on the accumulated integrator signal; and
based on the control signal, the amplifier retrieves one or more values from memory for one or more tunable parameters and uses the tunable parameters to optimize its operations for amplifying the second signal.

10. An amplifier for use in a transmitter circuit designed to operate over a specified transmit frequency range, wherein:
the amplifier is configured to receive and amplify an input signal having an input frequency within the specified transmit frequency range;
the amplifier is configured to receive a control signal corresponding to the input frequency of the input signal;
the amplifier is configured to use the control signal to automatically optimize its operations for amplifying the input signal;
the specified transmit frequency range is a base station forward-link transmit frequency range for a wireless telecommunication system;
the input frequency corresponds to a specific frequency block within the-base station forward-link transmit frequency range; and
the control signal identifies a sub-range within the base station forward-link transmit frequency range corresponding to the specific frequency block.

11. The invention of claim 10, wherein, based on the control signal, the amplifier retrieves one or more values from memory for one or more tunable parameters and uses the tunable parameters to optimize its operations for amplifying the input signal.

12. The invention of claim 10, wherein the amplifier is configured to receive a reset signal and to reset its operations based on the reset signal.

13. The invention of claim 10, wherein:
the base station forward-link transmit frequency range is a PCS base station forward-link transmit frequency range; and
the specific frequency block is one of six different PCS frequency blocks within the PCS base station forward-link transmit frequency range.

14. The invention of claim 13, wherein the control signal comprises a two-bit value identifying one of three different frequency sub-ranges within the PCS base station forward-link transmit frequency range.

15. The invention of claim 14, wherein:
based on the control signal, the amplifier retrieves one or more values from memory for one or more tunable parameters and uses the tunable parameters to optimize its operations for amplifying the input signal; and
the amplifier is configured to receive a reset signal and to reset its operations based on the reset signal.

16. A method for generating signals within a transmitter circuit designed to operate over a specified transmit frequency range, comprising the steps of:
(a) generating a first signal at a first frequency;
(b) converting the first signal into a second signal at a second frequency different from the first frequency, wherein the second frequency falls within the specified transmit frequency range and is specified by frequency information available within the transmitter circuit;
(c) generating a control signal based on the frequency information used to specify the second frequency; and
(d) amplifying the second signal with an amplifier, wherein the amplifier receives and uses the control signal to automatically optimize its operations for amplifying the second signal, wherein:
the specified transmit frequency range is a base station forward-link transmit frequency range for a wireless telecommunication system;
the second frequency corresponds to a specific frequency block within the base station forward-link transmit frequency range; and
the control signal identifies a sub-range within the base station forward-link transmit frequency range corresponding to the specific frequency block.

17. The invention of claim 16, wherein, based on the control signal, the amplifier retrieves one or more values from memory for one or more tunable parameters and uses the tunable parameters to optimize its operations for amplifying the second signal.

18. The invention of claim 16, wherein the frequency information is available as a 19-bit value that identifies one of six different frequency blocks within the specified transmit frequency range.

19. The invention of claim 16, further comprising the step of monitoring alarm signals within the transmitter circuit to generate a reset signal for the amplifier.

20. The invention of claim 16, wherein:
the base station forward-link transmit frequency range is a PCS base station forward-link transmit frequency range; and
the specific frequency block is one of six different PCS frequency blocks within the PCS base station forward-link transmit frequency range.

21. The invention of claim 20, wherein the control signal comprises a two-bit value identifying one of three different frequency sub-ranges within the PCS base station forward-link transmit frequency range.

22. The invention of claim 21, further comprising the step of monitoring alarm signals within the transmitter circuit to generate a reset signal for the amplifier, wherein:
based on the control signal, the amplifier retrieves one or more values from memory for one or more tunable parameters and uses the tunable parameters to optimize its operations for amplifying the second signal; and
the frequency information is available as a 19-bit value that identifies one of six different frequency blocks within the specified transmit frequency range.

23. A transmitter circuit designed to operate over a specified transmit frequency range, comprising:
(a) an oscillator configured to generate a first signal at a first frequency;
(b) an up-converter configured to convert the first signal into a second signal at a second frequency different from the first frequency, wherein the second frequency falls within the specified transmit frequency range and is specified by frequency information available within the up-converter; and
(c) an amplifier configured to amplify the second signal, wherein:
the up-converter generates a control signal for the amplifier based on the frequency information used to specify the second frequency;
the amplifier uses the control signal to automatically optimize its operations for amplifying the second signal; and
based on the control signal, the amplifier retrieves one or more values from memory for one or more tunable parameters and uses the tunable parameters to optimize its operations for amplifying the second signal.

24. A transmitter circuit designed to operate over a specified transmit frequency range, comprising:
(a) an oscillator configured to generate a first signal at a first frequency;
(b) an up-converter configured to convert the first signal into a second signal at a second frequency different from the first frequency, wherein the second frequency falls within the specified transmit frequency range and is specified by frequency information available within the up-converter;
(c) an amplifier configured to amplify the second signal; and
(d) an alarm control board configured to provide the up-converter with the frequency information, wherein:
the up-converter generates a control signal for the amplifier based on the frequency information used to specify the second frequency;
the amplifier uses the control signal to automatically optimize its operations for amplifying the second signal;
the up-converter comprises a programmable logic device configured to process the frequency information to generate the control signal for the amplifier; and
the frequency information is transmitted from the alarm control board to the up-converter as a 19-bit value that identifies one of six different frequency blocks within the specified transmit frequency range.

25. A transmitter circuit designed to operate over a specified transmit frequency range, comprising:
(a) an oscillator configured to generate a first signal at a first frequency;
(b) an up-converter configured to convert the first signal into a second signal at a second frequency different from the first frequency, wherein the second frequency falls within the specified transmit frequency range and is specified by frequency information available within the up-converter;
(c) an amplifier configured to amplify the second signal; and
(d) an alarm control board configured to provide the up-converter with the frequency information, wherein:
the up-converter generates a control signal for the amplifier based on the frequency information used to specify the second frequency;
the amplifier uses the control signal to automatically optimize its operations for amplifying the second signal;
the up-converter comprises a programmable logic device configured to process the frequency information to generate the control signal for the amplifier; and
the up-converter further comprises a processing block configured to monitor alarm signals from the up-converter to the alarm control board to generate a reset signal for the amplifier.

26. An amplifier for use in a transmitter circuit designed to operate over a specified transmit frequency range, wherein:
the amplifier is configured to receive and amplify an input signal having an input frequency within the specified transmit frequency range;
the amplifier is configured to receive a control signal corresponding to the input frequency of the input signal;
the amplifier is configured to use the control signal to automatically optimize its operations for amplifying the input signal; and
based on the control signal, the amplifier retrieves one or more values from memory for one or more tunable parameters and uses the tunable parameters to optimize its operations for amplifying the input signal.

27. An amplifier for use in a transmitter circuit designed to operate over a specified transmit frequency range, wherein:
the amplifier is configured to receive and amplify an input signal having an input frequency within the specified transmit frequency range;
the amplifier is configured to receive a control signal corresponding to the input frequency of the input signal;
the amplifier is configured to use the control signal to automatically optimize its operations for amplifying the input signal; and the amplifier is configured to receive a reset signal and to reset its operations based on the reset signal.

28. A method for generating signals within a transmitter circuit designed to operate over a specified transmit frequency range, comprising the steps of:

(a) generating a first signal at a first frequency;

(b) converting the first signal into a second signal at a second frequency different from the first frequency, wherein the second frequency falls within the specified transmit frequency range and is specified by frequency information available within the transmitter circuit;

(c) generating a control signal based on the frequency information used to specify the second frequency; and (d) amplifying the second signal with an amplifier, wherein the amplifier receives and uses the control signal to automatically optimize its operations for amplifying the second signal, wherein, based on the control signal, the amplifier retrieves one or more values from memory for one or more tunable parameters and uses the tunable parameters to optimize its operations for amplifying the second signal.

29. A method for generating signals within a transmitter circuit designed to operate over a specified transmit frequency range, comprising the steps of:

(a) generating a first signal at a first frequency;

(b) converting the first signal into a second signal at a second frequency different from the first frequency, wherein the second frequency falls within the specified transmit frequency range and is specified by frequency information available within the transmitter circuit;

(c) generating a control signal based on the frequency information used to specify the second frequency; and (d) amplifying the second signal with an amplifier, wherein the amplifier receives and uses the control signal to automatically optimize its operations for amplifying the second signal, wherein the frequency information is available as a 19-bit value that identifies one of six different frequency blocks within the specified transmit frequency range.

30. A method for generating signals within a transmitter circuit designed to operate over a specified transmit frequency range, comprising the steps of:

(a) generating a first signal at a first frequency;

(b) converting the first signal into a second signal at a second frequency different from the first frequency, wherein the second frequency falls within the specified transmit frequency range and is specified by frequency information available within the transmitter circuit;

(c) generating a control signal based on the frequency information used to specify the second frequency;

(d) amplifying the second signal with an amplifier, wherein the amplifier receives and uses the control signal to automatically optimize its operations for amplifying the second signal; and (e) monitoring alarm signals within the transmitter circuit to generate a reset signal for the amplifier.

* * * * *